United States Patent [19]

Iida et al.

[11] Patent Number: 4,930,442

[45] Date of Patent: Jun. 5, 1990

[54] MICROWAVE PLASMA CVD APPARATUS HAVING AN IMPROVED MICROWAVE TRANSMISSIVE WINDOW

[75] Inventors: Shigehira Iida; Takayoshi Arai; Junichiro Hashizume; Tetsuya Takei, all of Ueno; Keishi Saitoh, Nabari, all of Japan

[73] Assignee: Canon Kabushiki Kaisha, Tokyo, Japan

[21] Appl. No.: 173,605

[22] Filed: Mar. 25, 1988

[30] Foreign Application Priority Data

Mar. 27, 1987 [JP] Japan .................................. 62-73560

[51] Int. Cl.$^5$ ............................................. C23C 16/50
[52] U.S. Cl. .................................................... 118/723
[58] Field of Search .......................... 118/723; 501/153

[56] References Cited

U.S. PATENT DOCUMENTS

| 4,609,428 | 9/1986 | Fujimura | 156/643 |
| 4,720,471 | 1/1988 | Ando | 501/153 |
| 4,729,341 | 3/1988 | Fournier | 118/723 |
| 4,735,926 | 4/1988 | Ando | 501/153 |

FOREIGN PATENT DOCUMENTS

| 54-8363 | 4/1979 | Japan | 501/153 |
| 62-44577 | 2/1987 | Japan | 118/723 |
| 63-50479 | 3/1988 | Japan | 118/723 |

*Primary Examiner*—Richard Bueker
*Attorney, Agent, or Firm*—Fitzpatrick, Cella, Harper & Scinto

[57] ABSTRACT

An improved microwave plasma CVD apparatus for the formation of a thin film on a substrate by exciting glow discharge in a reaction chamber, comprising a substantially enclosed reaction chamber to receive the substrate, a means for supplying a film forming raw material gas into said reaction chamber and a means for introducing microwave energy into said reaction chamber, characterized in that said means for introducing microwave energy retains the gas atmosphere in said reaction chamber and as well as is constituted by a microwave transmissive material capable of introducing the microwave energy, said material being alumina ceramics containing glassy component such as $SiO_2$, CaO and MgO in an amount of 1 wt. % to 10 wt. % and substantially as other component α-alumina.

In the improved apparatus, the microwave transmissive window can be repeatedly used without being damaged for a long period of time and a desirable functional deposited film may be mass-produced at a high deposition rate.

3 Claims, 5 Drawing Sheets

MICROWAVE PLASMA CVD APPARATUS HAVING AN IMPROVED MICROWAVE TRANSMISSIVE WINDOW

FIELD OF THE INVENTION

This invention relates to a microwave plasma CVD apparatus for the formation of a deposited film on a substrate, particularly, a functional deposited film, more particularly, an amorphous semiconductor film suitable for use in semiconductor devices, electrophotographic sensitive devices, image input line sensors, image pickup devices and photoelectromotive force devices.

BACKGROUND OF THE INVENTION

Hitherto, as the element member of semiconductor device, photosensitive device for use in electrophotography, image input line sensor, image pickup device, photoelectromotive force device or other various electronic elements and optical elements, there have been proposed a number of amorphous semiconductor films, for instance, an amorphous silicon compensated with hydrogen or/and halogen (e.g., F, Cl) [hereinafter referred to as "A—Si(H,X)"]. Some of such films have been put to practical use.

These deposited films have been known to be formed by plasma CVD method wherein a raw material gas is decomposed by subjecting it to the action of an energy of direct current, high frequency or microwave to thereby form a deposited film on a substrate of glass, quartz, heat-resistant synthetic resin, stainless steel or aluminum.

Now, recent years, industrial attention has been focused on a microwave plasma CVD method (hereinafter referred to as MW-PCVD method) using the microwave glow discharge decomposition.

One representative known apparatus for the formation of a deposited film by way of MW-PCVD method is such that has a structure as shown by a schematic perspective view of FIG. 3. In FIG. 3, 301 is a reaction chamber having a substantially enclosed structure. 302 is a microwave transmissive window made of an dielectric material (such as quartz glass, alumina ceramics, etc.) that can transmit efficiently microwave into the reaction chamber and can retain the vacuum. 303 is a metallic waveguide to propagate the microwave, and it is connected through a matching box, isolator (not shown) to a microwave power source (not shown). 304 is an exhaust pipe that one end is open to the reaction chamber 301 and the other end is connected to an exhaust apparatus (not shown). 305 is a substrate placed on a substrate holder in which electric heater 307 being provided, on which a deposited film is to be formed, and 306 is a discharge space surrounded by substrates 305.

Deposited film formation according to the conventional deposited film forming apparatus is conducted in the following way. That is, the exhaust valve is opened, and the reaction chamber 301 is evacuated by the vacuum pump (not shown) to adjust the inner pressure in the reaction chamber to $1 \times 10^{-7}$ Torr or less. Then, the heater 307 is activated to heat the substrate 305 at temperature suitable for the formation of a deposited film, and the substrate is kept at this temperature. Thereafter, in the case of forming an amorphous silicon deposited film, silane gas, hydrogen gas and like raw material gas are introduced through a gas introducing means (not shown) into the reaction chamber 301. Simultaneously, the microwave power source is actuated to generate the microwave with frequency of at least 500 MHz, preferably 2.45 GHz, and the microwave is introduced through the waveguide and the microwave transmissive window 302 into the reaction chamber 301. Thus, the gas in the reaction chamber 301 is activated and dissociated to form a deposited film on the surface of the substrate 305.

In such conventional deposited film forming apparatus, there often occur problems on the durability of the transmissive window and the transmission efficiency, when introducing microwave into the reaction chamber. Hitherto, there have been used for the microwave transmissive window, materials having a low dielectric constant (E) and dielectrics loss angle (tan δ) to prevent the transmission loss as much as possible. Such materials are berylia (BeO), teflon, alumina ceramics, etc. Further, it is required for the transmissive window material to have sufficient resistances to, the discharged heat radiation, to thermal impact and a also to a vacuum retentivity. However, desirable materials having such characteristics have not been found. In fact, in the case of using the conventional microwave transmissive window, the microwave power is introduced continuously at a range of 10 W/cm² to 50 W/cm² to cause and continue the plasma discharge, and in this case, the window material will be damaged in a short time. That is, the known dielectric material to constitute the microwave transmissive window is not durable enough for continued use. In view of this, there is an increased demand to provide a desirable material which enables the preparation of a microwave transmissive window to meet the above conditions desired therefore and which is sufficiently durable for continued use.

SUMMARY OF THE INVENTION

The present invention is to solve the aforementioned various problems encountered with conventional apparatus, and in reply to the above demand, it is to provide an improved apparatus (MW-PCVD apparatus) capable of forming a deposited film stably and at high deposition rate by way of MW-PCVD method. Thus formed film is useful as element member used for semiconductor devices, electrophotographic photosensitive members, image input line sensors, image pickup devices, photoelectromotive force devices. To be concrete, firstly, the present invention is to provide a highly durable microwave transmissive material having an excellent heat resistance. Secondly, the present invention is to provide a highly durable microwave transmissive window material having an excellent heat impact resistance. Thirdly, the present invention is to provide a microwave transmissive window material having an excellent vacuum retentivity. Fourthly, the present invention is to provide a microwave transmissive window material having excellent microwave power transmittance characteristics.

These objects of the present invention can be accomplished by the use of a specific alumina ceramics containing at least 1 wt.% and at most, 10 wt.% of glassy component, preferably from 1 wt.% to 8 wt.% of glassy component, and as other component α-alumina, as the microwave transmissive material to constitute the microwave transmissive window. This specific alumina ceramics shows very efficient microwave transmittance, and is sufficiently stable upon continued use for a long period of time. And the microwave transmissive window prepared using this specific alumina ceramics makes it possible to provide a desirable MW-PCVD apparatus which enable to mass-produce a desirable deposited functional film at a high deposition rate.

DESCRIPTION OF THE INVENTION

Figure 1A:
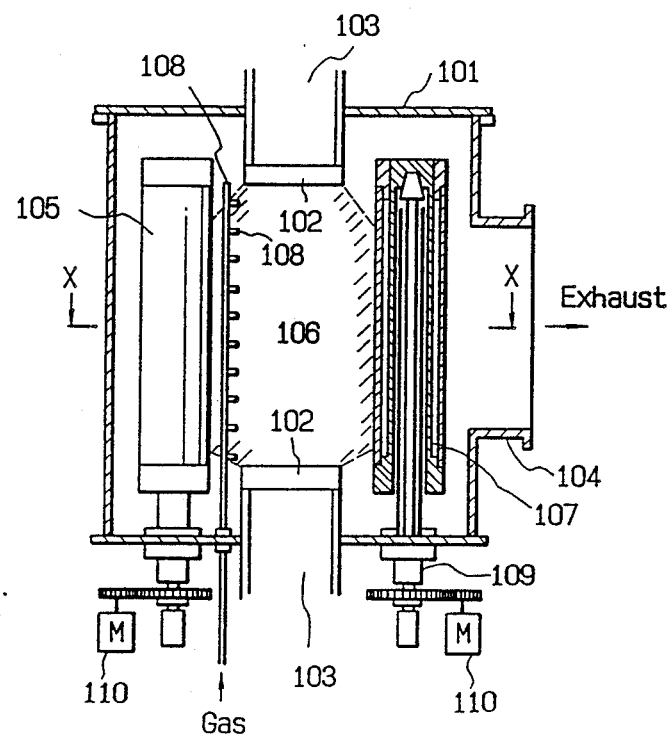
FIG. 1(A) is a schematic longitudinal sectional view, partly broken away, of the MW-PCVD apparatus according to the present invention which is suited for practicing a MW-PCVD process.

The present invention has been accomplished based on the below-mentioned findings obtained as a result of extensive studies by the present inventors in order to attain the foregoing objects.

Firstly, as a result of extensive studies in order to overcome the aforementioned problems on the conventional MW-PCVD apparatus, the present inventors have come to the conclusion that it is an essential factor to provide such microwave transmissive window that can transmit the microwave power supplied from a microwave generator, efficiently and stably into the reaction vessel. Then, the present inventors have found highly durable microwave transmissive alumina ceramics.

Conventional alumina ceramics are referred to such ceramics containing about at least 80 wt.% of α-alumina component, other than this, SiO₂, MgO, CaO and like glassy components as impurities.

Heat resistance, mechanical strength, insulating property, etc., which are the characteristics of alumina ceramics, are dependent upon the content of glassy component. And, it is known that highly purified alumina ceramics of which the content of α-alumina being raised and the content of glassy components being lowered are generally excellent in thermal, mechanical and electric properties, and in particular, alumina ceramics with α-alumina content of at least 99.5 wt.% show excellent characteristics.

However, the present inventors has found the fact as a result of repeated experiments that even for such high purity alumina ceramics, when they are used for the microwave transmissive window, they do not always show excellent characteristics as expected. And the present inventors have finally found that the following alumina ceramics material is effective to attain the objects of the present invention; alumina ceramics material containing as impurity glassy component in an amount of 1-10 wt.% and as the remaining component α-alumina, preferably glassy component in an amount of 1-8 wt.% and as the remaining component α-alumina.

Now, it is required for the microwave transmissive window to be excellent in vacuum retentivity, heat resistance, heat impact resistance and microwave transmittance. The microwave transmissive window made of conventional window material is likely to be damaged in a short period of time due to the heat generation caused by absorption of microwave and due to the thermal impact caused by radiation heat from the plasma discharge space. However, it is possible to form a deposited film continuously and stably by using as the microwave transmissive window material the alumina ceramics material according to the present invention.

For the present alumina ceramics according to the present invention, it is necessary that the glassy component as impurity is present at the optimum range for the microwave transmissive window material. That is, when the content of the glassy component exceeds 10 wt.%, the alumina ceramics becomes low in the heat conductivity since the glass component itself is of heat conductivity inferior to α-alumina, and such alumina ceramics cannot endure heat impacts due to the heat generated by microwave absorption and the radiant heat of plasma, and it will be destructed. On the other hand, when the content of the glassy component is less than 1 wt.%, i.e. when the content of α-alumina exceeds 99.5%, such ceramics may become usable for general uses by calcination at high temperature. However, such alumina ceramics are not suitable as the microwave transmissive window material, since the binding strength of each alumina particles therein is low and the ceramics cannot endure the heat impacts due to the heat generated by microwave absorption and the radiant heat of plasma, and as a result, the ceramics will be destructured unsatisfactorily.

The alumina ceramics material according to the present invention which contains as impurity 1-10 wt.%, preferably 1-8 wt.% of glassy component and as the remaining component α-alumina is very stable to the severe thermal stress which is caused by both the inner heat generated by absorption of microwave and the outer heat caused by the radiation of plasma generated at the side of the reaction chamber, which always occurs on the microwave transmissive window of a MW-PCVD apparatus. And the use of a microwave transmissive window made of said alumina ceramics material makes it possible to continuously carry out the plasma reaction using microwave to cause the formation of a deposited film in the MW-PCVD apparatus.

Hereinafter, the microwave transmissive window material of the present invention will be explained in more details with reference to the following examples. However, the structure of the microwave transmissive window material of the present invention and the deposited film forming apparatus by way of MW-PCVD method are not limited to these examples.

Figure 1B:
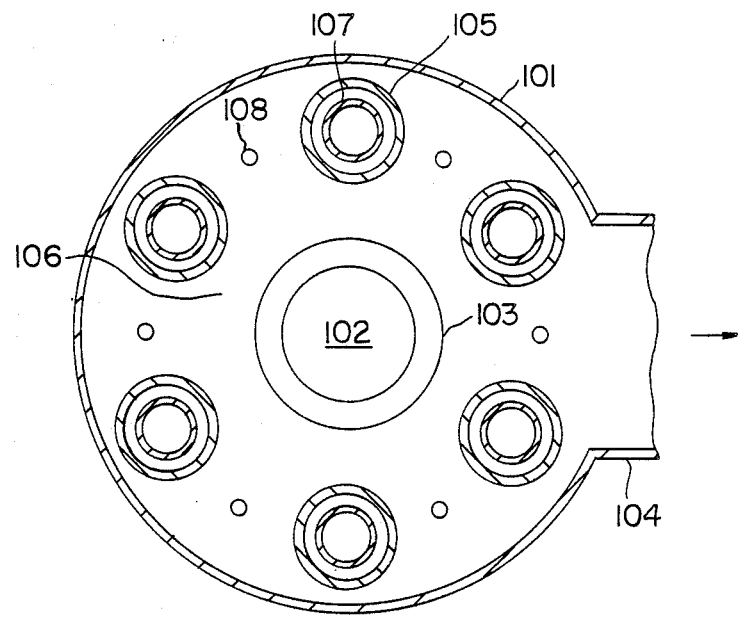
FIG. 1(B) is a schematic partial cross-sectional view for the X—X line of the MW-PCVD apparatus shown in FIG. 1(A).

FIG. 1(A) is a schematic longitudinal sectional view of the MW-PCVD apparatus using the microwave transmissive window material of the present invention. FIG. 1(B) is a schematic partial sectional view for the X—X line of the apparatus shown in FIG. 1(A).

The MW-PCVD apparatus shown in FIGS. 1(A) and 1(B) comprises substantially enclosed reaction chamber 101 having a reaction space (discharge space) 106, microwave transmissive windows 102 made of the alumina ceramics material according to the present invention, metallic waveguides 103 being connected through impedance matching box and isolator to microwave power source (not shown), exhaust pipe 104 being connected through a main valve to an exhaust pump such as oil diffusion pump, mechanical booster pump, etc. (not shown), a plurality of cylindrical substrates 105 placed on the respective substrate holders in each of which electric heater 107 being installed and each of which being mechanically connected to a rolating motor (not shown), a plurality of gas feed pipes 108 each having a plurality of gas liberation holes 108' comprised of bar-like shaped nozzles and being connected through mass flow controllers (not shown) to gas reservoirs for raw material gases.

The gas feed pipes 108 are made of microwave transmissive dielectric material. The gas liberation holes 108' provided with each of the gas feed pipes 108 are so open that raw material gas may be uniformly fed into the reaction space (discharge space) 106.

The shape of the microwave transmissive window 102 is not limited to circular or square shapes. In this example, there is used a disk-like shaped one as shown in FIG. 2.

Figure 2:
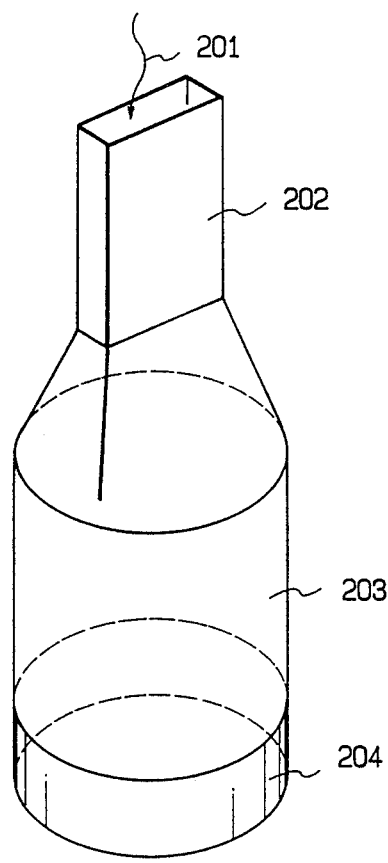
FIG. 2 is a schematic sketch view of the microwave transmissive window in the MW-PCVD apparatus shown in FIG. 1(A).
Figure 2:
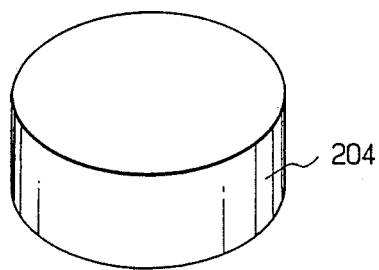
Figure 3:
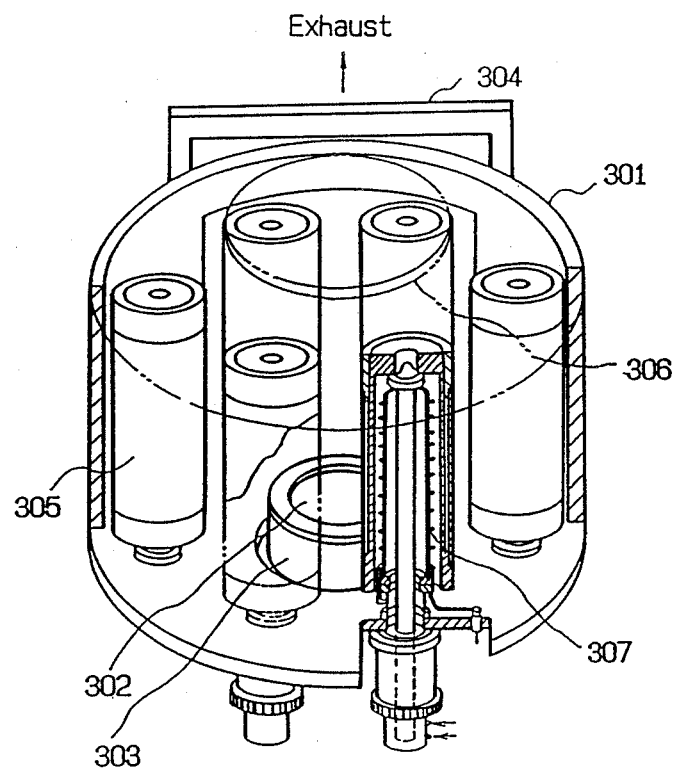
FIG. 3 is a schematic perspective view, partly broken away, of the known MW-PCVD apparatus.

Referring to FIG. 2, microwave power 201 is introduced through square shape waveguide 202, circular waveguide 203 then the microwave transmissive window 204 into the reaction space [106 in FIG. 1(A)]. In FIG. 2, the square waveguide 202 is converted to the circular waveguide 203 using a horn shaped converting member. However, it can be connected directly to the circular waveguide without the use of such horn shaped converting member. In addition, the square waveguide 202 can be connected directly to the microwave transmissive window 204 without the use of the circular converting member. The microwave transmissive window 204 may be properly designed in the case where the microwave mode used is TE$_{11}$, in accordance with the known following equation.

$$\lambda = 2\pi / \sqrt{(1.84/a \sqrt{\bar{\epsilon}})^2 + (\pi/d \sqrt{\bar{\epsilon}})^2}$$

In the equation, $\lambda$ shows the resonant wavelength (12.245 cm in case of 2.45 GHz microwave); a is diameter (cm) of the cylindrical transmissive window; d is thickness (cm); and $\bar{\epsilon}$ is specific inductive capacity.

In this way, it is possible for the resonant conditions to be satisfied at the thickness d=1.91 cm in the case where the specific inductive capacity $\bar{\epsilon}$ the alumina ceramics material according to the present invention $\approx$ 10 and the diameter a=10.16 cm. Here, the length of said d=1.91 cm corresponds to the length ½ times as long as the wavelength of the microwave propagated in the alumina ceramics material. In a preferred embodiment for the microwave transmissive window 204 in the size of a=10.16 cm and d=1.91 cm comprising the alumina ceramics material, it is of a single plate structure with regard to the thickness direction. However there is no trouble even when it is constituted by a plurarity of plates with dividing the direction of the thickness. In the present example, the thickness d is made 1.91 cm by overlapping two disks made of the alumina ceramics material, respectively having the thickness of 1.27 cm and 0.64 cm.

In the following examples, evaluations about the transmissive window material were made using the MW-PCVD apparatus shown in FIGS. 1(A) and 1(B). And there were used a plurality of alumina ceramics materials having the different content of glassy component, under the conditions of preparing drum shaped electrophotosensitive members. Preparation of the electrophotosensitive member in every example is conducted as follows.

That is, the reaction chamber 101 is evacuated by opening the exhaust valve of the exhaust pipe 104 to bring about the inside to a desired vacuum. Then, the heater 107 is actuated to uniformly heat the substrate 105 to a desired temperature and it is kept at this temperature. Concurrently, the motor (not shown) is started to rotate the substrates 105 and they are kept rotating at a desired constant rotation speed.

Successively, in the case of forming an amorphous silicon film for example, silane gas (SiH$_4$) and H$_2$ gas are supplied through the gas feed pipes 108 into the reaction chamber 101 at respective desired flow rates. After the flow rates of the raw material gases will have become stable, a microwave of 2.45 GHz from the microwave power source is supplied through the waveguides 103 and the microwave transmissive windows 102 in the reaction chamber 101, wherein the raw material gases are excited with a microwave energy as supplied to generate plasmas containing neutral radical particles, ion particles, electrons, etc. The thus resulted plasmas become mutually reacted to thereby form a deposited film on the surface of each of the rotating substrates 105.

EXAMPLE 1

As microwave transmissive window material there were used various alumina ceramics materials having different content of glassy component, and continuous discharge was conducted under the conditions of discharge shown in Table 1 to measure the stability of discharge and the discharge keeping time required for the continuous discharge to become impossible due to destruction of the alumina ceramics material. The results were as shown in Table 2.

As is apparent from the Table 2, it was found that the alumina ceramics materials according to the present invention were excellent in both the discharge stability and the heat resistance.

EXAMPLE 2

As the microwave transmissive window materials, there were used various alumina ceramics materials having different content of glassy component. Continuous discharge was conducted under the conditions shown in Table 3 to measure the deposition rate at which the deposited film is formed on a cylindrical substrate and the discharge keeping time required for the continuous discharge to become impossible due to destruction of the microwave transmissive window. The results were as shown in Table 4.

As is apparent from the results shown in Table 4, it is found that in the case of using the alumina ceramics materials according to the present invention, there are excellent results in the deposition rate, the microwave transmittance at the microwave transmissive window, the discharge stability and also in the heat resistance. The reason why the deposition rate is decreased in the case where the alumina ceramics material having more than 10 wt.% of glassy component used, is that the glassy component has worse heat-conductivity, and because of this, the film deposited on the surface of the alumina ceramics material used as the microwave transmissive window becomes crystallized due to high temperature to thereby hinder the microwave transmittance, and as a result, the deposition rate is decreased and the microwave transmissive window is destructed.

EXAMPLE 3

Figure 4:
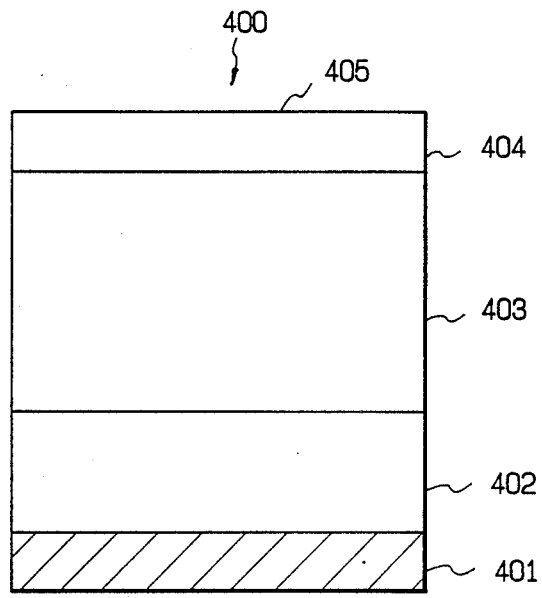
FIG. 4 is a schematic cross-sectional view of an electrophotographic photosensitive member prepared in Example 3 of this invention.

Using the MW-PCVD apparatus shown in FIGS. 1(A) and 1(B), under the film forming conditions shown in Table 5, and using the microwave transmissive windows made of the alumina ceramics materials shown in Table 4, there were prepared a plurality of electrophotographic photosensitive member samples of the type 400 shown in FIG. 4.

In FIG. 4, there are shown substrate 401, a first layer (charge injection inhibition layer) 402, a second layer (carrier generation and transportation layer) 403, and a third layer (surface protective layer) 404.

Electrophotographic photosensitive member Samples (Sample Nos. D3-1 to D3-8) were prepared using the alumina ceramics windows (2-1 to 2-8) in Example 2.

Results on occurrence of destruction of alumina ceramics window during the film formation process and the electrophotographic characteristics of the resultant samples were as shown in Table 6.

That is, the alumina ceramics window Samples 2-1, 2-7 and 2-8 were destructed during the film formation process as well as in Example 2. On the other hand, the alumina ceramics window Samples 2-2 to 2-6 were not destructed.

In addition, the resultant electrophotographic photosensitive member samples were evaluated using a known Canon's copier (product of CANON KABUSHIKI KAISHA: NP7550).

The Samples D3-1, D3-7 and D3-8 became thin due to destruction of the alumina ceramics window, and these could not be evaluated on their electrographic characteristics as shown in Table 6. The Samples D3-2 to D3-6 in which the alumina ceramics windows were not destructed, showed the practically satisfactory electrophotographic characteristics as shown in Table 6.

As shown by the examples given above, it is understood that alumina ceramics materials having at least 1 wt.% and at most 10 wt.% of glassy component, preferably at least 1 wt.% and at most 8 wt.% of glassy component and as other component α-alumina, which are used as the microwave transmissive materials in the MW-PCVD apparatus, show very efficient microwave transmittance and show very stable characteristics even upon repeating use for a long period of time.

In view of the above, it can be recognized that when the microwave transmissive window made of such alumina ceramics material is used, it is possible to provide a desirable MW-PCVD apparatus, which makes it possible to mass-produce a desirable deposited film at a high deposition rate.

TABLE 1

| Gas used | argon |
|---|---|
| Inner pressure | 10 mTorr |
| Microwave power (2.45 GHz) | 2000 w × 2 = 4000 W |

TABLE 2

| Sample No. | Composition of alumina ceramics (glassy material/alumia material) | Continuously discharged period until the microwave transmissive window damaged | Judgement |
|---|---|---|---|
| 1-1 | 0.5/99.5 | 5 min. | X |
| 1-2 | 1.0/99.0 | 160 min. or more | ⊚ |
| 1-3 | 3.0/97.0 | 160 min. or more | ⊚ |
| 1-4 | 5.0/95.0 | 160 min. or more | ⊚ |
| 1-5 | 8.0/92.0 | 160 min. or more | ⊚ |
| 1-6 | 10.0/90.0 | 155 min. | O |
| 1-7 | 15.0/85.0 | 29 min. | X |
| 1-8 | 20.0/80.0 | 22 min. | X |

Note: ⊚: Excellent, O: Good, X: not Applicable

TABLE 3

| Gas used & its flow rate | $SiH_4$ | 800 sccm |
|---|---|---|
| | $H_2$ | 500 sccm |
| Inner pressure | 2 m Torr | |
| Microwave power (2.45 GHz) | 1000 W × 2 = 2000 W | |

TABLE 4

| Sample No. | Composition of alumina ceramics (glassy material/ alumia material) | Continuously discharged period until the microwave transmissive window damaged | Deposition rate (Å/sec.) | Judgement |
|---|---|---|---|---|
| 2-1 | 0.05/99.5 | 12 min. | 96 | X |
| 2-2 | 1.0/99.0 | 120 min. or more | 94 | ⊚ |
| 2-3 | 3.0/97.0 | 120 min. or more | 95 | ⊚ |
| 2-4 | 5.0/95.0 | 120 min. or more | 96 | ⊚ |
| 2-5 | 8.0/92.0 | 120 min. or more | 94 | ⊚ |
| 2-6 | 10.0/90.0 | 103 min. | 90 | O |
| 2-7 | 15.0/85.0 | 21 min. | 61 | X |
| 2-8 | 20.0/80.0 | 18 min. | 42 | X |

Note: ⊚: Excellent, O: Good, X: not Applicable

TABLE 5

| Constituent layer | Gas Used | Flow rate (SCCM) | Inner pressure (Torr) | Discharging power (W) | Substrate temperature (°C.) | Layer thickness (μm) |
|---|---|---|---|---|---|---|
| First layer | $SiH_4$ | 800 | $2 \times 10^{-3}$ | 2000 | 300 | 5 |
| | $SiF_4$ | 20 | | | | |
| | $B_2H_6/H_2$ (= 3000 ppm) | 500 ppm | | | | |
| Second layer | $SiH_4$ | 800 | $2 \times 10^{-3}$ | 2000 | 300 | 30 |
| | $B_2H_6/H_2$ (= 10 ppm) | 2 ppm | | | | |
| Third layer | $SiH_4$ | 100 | $2 \times 10^{-3}$ | 1500 | 300 | 0.5 |

TABLE 5-continued

| Constituent layer | Gas Used | Flow rate (SCCM) | Inner pressure (Torr) | Discharging power (W) | Substrate temperature (°C.) | Layer thickness (μm) |
| --- | --- | --- | --- | --- | --- | --- |
| layer | CH₄ | 500 | | | | |

TABLE 6

| Sample No. | Sample No. of alumina ceramics (same as in Table 4) | Occurrence of damage on microwave transmissive window | Electrophotographic characteristics |
| --- | --- | --- | --- |
| D3-1 | 2-1 | X | impossible to measure |
| D3-2 | 2-2 | O | sufficient |
| D3-3 | 2-3 | O | sufficient |
| D3-4 | 2-4 | O | sufficient |
| D3-5 | 2-5 | O | sufficient |
| D3-6 | 2-6 | O | sufficient |
| D3-7 | 2-7 | X | impossible to measure |
| D3-8 | 2-8 | X | impossible to measure |

Note: X: occurred, O: not occurred

What we claim is:

1. An apparatus for the formation of a functional silicon-containing deposited film on a plurality of cylindrical substrate by means of a microwave plasma chemical vapor deposition process conducted in a substantially enclosed deposition chamber, said deposition chamber being cylindrical and comprising a circumferential wall having an end portion thereof hermetically provided with a microwave introducing window to which a waveguide extending from a microwave power source is connected, said microwave introducing window being formed of an alumina ceramic consisting of α-alumina and from 1 to 8 wt.% of one or more glassy component selected from the group consisting of SiO₂, CaO, and MgO, said cylindrical deposition chamber having a discharge space with a plurality of rotatable cylindrical substrate holders circumferentially positioned around a longitudinal axis of said discharge space, each rotatable cylindrical substrate holder provided with an electric heater therein, each said rotatable cylindrical substrate holder capable of having mounted thereon one of said cylindrical substrates, said rotatable cylindrical substrate holders being arranged at intervals said cylindrical deposition chamber also being provided with a plurality of gas feed pipes for supplying a film-forming raw material gas into said discharge space and means for evacuating said cylindrical deposition chamber, each said gas feed pipe being arranged between two of said rotatable cylindrical substrate holders so as to permit the film-forming raw material gas to be supplied into said discharge space.

2. The apparatus according to claim 1, wherein each of said plurality of gas feed pipes is of a microwave transmissive material.

3. A microwave plasma chemical vapor deposition process for forming an amorphous silicon-containing semiconductor film on a plurality of cylindrical substrates suitable for use in an electrophotographic photosensitive device in the apparatus of claim 2, which comprises the steps of:

(a) placing one of said cylindrical substrates on each of said cylindrical substrate holders, (b) evacuating said cylindrical deposition chamber to bring the interior of said chamber to a predetermined vacuum, (c) supplying a film-forming raw material gas through said plurality of gas feed pipes into said discharge space while rotating said cylindrical substrate holders and maintaining said cylindrical substrates at a predetermined temperature, (d) introducing a microwave energy through said microwave introducing window into said discharge space to cause glow discharge, and (e) maintaining said glow discharge for a desired period of time to thereby form a functional deposited film on said cylindrical substrates.

* * * * *

UNITED STATES PATENT AND TRADEMARK OFFICE
CERTIFICATE OF CORRECTION

PATENT NO. : 4,930,442
DATED : June 5, 1990
INVENTOR(S) : SHIGEHIRA IIDA, ET AL.

It is certified that error appears in the above-identified patent and that said Letters Patent is hereby corrected as shown below:

Title Page:

IN [57] ABSTRACT

Line 10, "as well as" should be deleted.
    Line 15 "other" should read --the other--.

COLUMN 1

Line 33, "recent" should read --in recent--.
    Line 42, "an" should read --a--.
    Line 52, "being" should read --is--.
    Line 54, "substrates 305." should read --substrate 305.--.
    Line 61, "at" should read --to a--.

COLUMN 2

Line 15, "berylia" should read --beryllia--.
    Line 17, "to," should read --to--.
    Line 18, "a" (first occurrence) should be deleted.
    Line 42, "as" should read --as an-- and "member" should read --member to be--.
    Line 60, "other" should read --the other--.

COLUMN 3

Line 1, "enable" should read --enables--.
    Line 50, "has" should read --have--.

UNITED STATES PATENT AND TRADEMARK OFFICE
CERTIFICATE OF CORRECTION

PATENT NO. : 4,930,442

DATED : June 5, 1990

INVENTOR(S) : SHIGEHIRA IIDA, ET AL.

It is certified that error appears in the above-identified patent and that said Letters Patent is hereby corrected as shown below:

COLUMN 4

Line 16, "destructed" should read --destroyed--.
    Line 23, "particles" should read --particle--.
    Line 27, "destructured" should be deleted.
    Line 66, "being" should read --is--.

COLUMN 6

Line 8, "will" should be deleted.
    Line 52, "having" should read --has--.
    Line 61, "destructed" should read --destroyed--.

COLUMN 7

Line 16, "destructed" should read --destroyed--.
    Line 19, "destructed" should read --destroyed--.
    Line 39, "electrographic" should read --electrophotographic--.

COLUMN 8

Line 1, "destructed" should read --destroyed--.
    Line 7, "other" should read --the other--.
    TABLE 1, "2000 w" should read --2000 W--.
    TABLE 2, "alumia" should read --alumina--.
    TABLE 4, "alumia" should read --alumina--.

UNITED STATES PATENT AND TRADEMARK OFFICE
CERTIFICATE OF CORRECTION

PATENT NO. : 4,930,442

DATED : June 5, 1990

INVENTOR(S) : SHIGEHIRA IIDA, ET AL.

It is certified that error appears in the above-identified patent and that said Letters Patent is hereby corrected as shown below:

COLUMN 9

```
Line 23, "substrate" should read --substrates--.
Line 33, "component" should read --components--.
Line 42, "intervals" should read --intervals,--.
```

Signed and Sealed this

Twenty-second Day of September, 1992

Attest:

DOUGLAS B. COMER

Attesting Officer

Acting Commissioner of Patents and Trademarks